(12) United States Patent
Ma

(10) Patent No.: US 6,204,537 B1
(45) Date of Patent: Mar. 20, 2001

(54) ESD PROTECTION SCHEME

(75) Inventor: Manny Kin F. Ma, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/164,301

(22) Filed: Oct. 1, 1998

(51) Int. Cl.$^7$ .................................................. H01L 23/62
(52) U.S. Cl. ........................ 257/360; 257/355; 257/361; 257/362
(58) Field of Search .................................. 257/355, 360, 257/361, 362; 438/309

(56) References Cited

U.S. PATENT DOCUMENTS

| | | | |
|---|---|---|---|
| 4,630,162 | 12/1986 | Bell et al. .............................. | 361/56 |
| 4,876,584 | 10/1989 | Taylor .................................. | 257/356 |
| 4,885,618 | * 12/1989 | Schubert et al. ...................... | 257/362 |
| 5,196,981 | 3/1993 | Kuo ........................................ | 361/56 |
| 5,225,702 | * 7/1993 | Chatterjee ............................ | 257/360 |
| 5,405,806 | * 4/1995 | Pfiester et al. ........................ | 438/630 |
| 5,463,520 | 10/1995 | Nelson .................................. | 361/56 |
| 5,508,649 | 4/1996 | Shay ...................................... | 327/318 |
| 5,596,216 | * 1/1997 | Yanagigawa .......................... | 257/355 |
| 5,742,084 | 4/1998 | Yu ........................................ | 257/356 |
| 5,910,673 | * 6/1999 | Hsu et al. ............................. | 257/355 |
| 6,140,683 | * 10/2000 | Duvvury et al. ...................... | 257/360 |

OTHER PUBLICATIONS

E. Fujishin, K. Garrett, M.P. Levis, R.F. Motta, M.D. Hartranft, Optimized ESD Protection Circuits For High–Speed MOS/VLSI, 1984 IEEE, pp. 569–573.
S. Wolf, Silicon Processing for the VLSI Era—vol. III, 1995, pp. 198–200.
S. Wolf, Silicon Processing for the VLSI Era—vol. II, 1990, pp. 341–347.
S. Wolf, Silicon Processing for the VLSI Era—vol. II, 1990, pp. 441–446.

* cited by examiner

Primary Examiner—Eddie C. Lee
Assistant Examiner—George C. Eckert, II
(74) Attorney, Agent, or Firm—Killworth, Gottman, Hagan & Schaeff, L.L.P.

(57) ABSTRACT

An integrated circuit device is provided comprising an integrated circuit pad, an internal integrated circuit, and an ESD protection circuit. The internal integrated circuit is conductively coupled to the integrated circuit pad so as to define a primary electrical path from the integrated circuit pad to the internal integrated circuit. The ESD protection circuit is conductively coupled to the integrated circuit pad so as to define a secondary electrical path from the integrated circuit pad to the ESD protection circuit. The ESD protection circuit comprises a semiconductor structure arranged to define a doped silicon substrate, a drain region, a source region, an electrically insulating region, and a gate structure. The drain region is formed in the silicon substrate and is conductively coupled to the integrated circuit pad via the secondary electrical path. The source region is formed in the silicon substrate and is conductively coupled to a relatively low electrical potential. The electrically insulating region is formed in the silicon substrate between the drain region and the source region. The gate structure is conductively coupled to a relatively low electrical potential and is arranged to define an incipient inversion layer in the drain region upon application of a relatively high electrical potential to the integrated circuit pad. The gate structure and the electrically insulating region are arranged to define an active gate region limited to extend from the drain region to the electrically insulating region.

48 Claims, 1 Drawing Sheet

ESD PROTECTION SCHEME

BACKGROUND OF THE INVENTION

The present invention relates to an electrostatic discharge (ESD) protection scheme for integrated circuit devices and, more particularly to an ESD protection scheme with improved turn-on performance.

As is explained in detail by S. Wolf in Silicon Processing for the VLSI Era, Volume 2, 1990, the input signals to a metal-oxide-silicon integrated circuit (MOS IC) are fed to the gates of MOS transistors within the integrated circuit. If the voltage applied to the gate insulator is excessive, the gate oxide will break down. The dielectric breakdown strength of $SiO_2$ is approximately $8 \times 10^6$ V/cm; thus, most gate oxides will not tolerate voltages greater than 12–15 V without breaking down. Although this is well in excess of the normal operating voltages of 5 V integrated circuits, voltages higher than this may be impressed upon the circuit integrated circuit pads as a result of human-operator or mechanical handling operations.

The main source of such high voltages is triboelectricity (electricity caused when two materials are rubbed together). A person can develop very high static voltage (a few hundred to a few thousand volts) simply by walking across a room or by removing an integrated circuit from its plastic package. If such a high voltage is accidently applied to the pins of an IC package, the resulting electrostatic discharge (ESD) can cause breakdown of the respective gate oxides to which it is applied. The breakdown event may cause sufficient damage to produce immediate destruction of the device, or it may weaken the oxide enough that it will fail early in the operating life of the device.

It has become a widely held practice to provide ESD protection circuits for all the integrated circuit pads or pins of MOS ICs. The need for such circuits is particularly acute for VLSI devices in such high-noise environments as personal computers, automobiles, and manufacturing control systems. These protective circuits, normally placed between the input and output pads on a chip and the transistor gates to which the pads are connected, are designed to begin conducting or to undergo breakdown when the integrated circuit pads are at a relatively high electrical potential, thereby providing an electrical path to ground or the power supply rail. Since the breakdown mechanism is designed to be nondestructive, the circuits provide a normally open path that closes only when a high voltage appears at the input or output terminals, harmlessly discharging the node to which it is connected.

Unfortunately, many of the existing ESD protection schemes do not provide a sufficiently low threshold turn-on voltage for the associated integrated circuit or are prohibitively complex and expensive to manufacture. Accordingly, there is a continuing need for ESD protection schemes that provide a sufficiently low threshold turn on voltage while doing so with a semiconductor structure that is reliable and relatively inexpensive to manufacture.

BRIEF SUMMARY OF THE INVENTION

This need is met by the present invention wherein a reliable and low threshold ESD protection scheme is provided by modifying the structure of a conventional MOSFET device.

In accordance with one embodiment of the present invention, an integrated circuit device is provided comprising an integrated circuit pad, an internal integrated circuit, and an ESD protection circuit. The internal integrated circuit is conductively coupled to the integrated circuit pad so as to define a primary electrical path from the integrated circuit pad to the internal integrated circuit. The ESD protection circuit is conductively coupled to the integrated circuit pad so as to define a secondary electrical path from the integrated circuit pad to the ESD protection circuit. The ESD protection circuit comprises a semiconductor structure arranged to define a doped silicon substrate, a drain region, a source region, an electrically insulating region, and a gate structure. The drain region is formed in the silicon substrate and is conductively coupled to the integrated circuit pad via the secondary electrical path. The source region is formed in the silicon substrate and is conductively coupled to a relatively low electrical potential. The electrically insulating region is formed in the silicon substrate between the drain region and the source region. The gate structure is conductively coupled to a relatively low electrical potential and is arranged to define an incipient inversion layer in the drain region upon application of a relatively high electrical potential to the integrated circuit pad. The gate structure and the electrically insulating region are arranged to define an active gate region limited to extend from the drain region to the electrically insulating region.

The size and location of the electrically insulating region formed in the silicon substrate are preferably such that, upon application of the relatively high electrical potential to the integrated circuit pad, an electrostatic discharge current path between the source region and the drain region tends to follow a path through the silicon substrate substantially offset from the active gate region and around the electrically insulating region.

The doped silicon substrate preferably comprises a doped p-type silicon substrate and the drain region and the source region comprise doped $n^+$ regions. The relatively high electrical potential may be a positive electrical potential or a negative electrical potential.

In accordance with another embodiment of the present invention, an integrated circuit device is provided comprising an integrated circuit pad, an internal integrated circuit, and an ESD protection circuit. The ESD protection circuit comprises a semiconductor structure arranged to define a doped silicon substrate, a drain region, a source region, an electrically insulating region, and a gate structure. The gate structure of the ESD protection circuit is arranged to overlap a portion of the drain region such that, upon application of a relatively high electrical potential to the integrated circuit pad, gate-induced drain leakage current flows in the silicon substrate. Further, the gate structure and the electrically insulating region are arranged to define an active gate region limited to extend from the drain region to the electrically insulating region, such that the gate-induced drain leakage current tends to follow a path through the silicon substrate substantially offset from the active gate region.

The gate structure may further be arranged to define an incipient inversion layer in the drain region upon application of a relatively high electrical potential to the integrated circuit pad. The drain region, the source region, and the silicon substrate may be arranged to form a junction transistor having a characteristic breakdown voltage above which breakdown voltage breakdown current flows in the silicon substrate between the source region and the drain region. The gate-induced drain leakage current preferably reduces the characteristic breakdown voltage of the junction transistor and the size and location of the electrically insulating region formed in the silicon substrate are such that the resulting breakdown current tends to follow a path substantially offset from the active gate region.

In accordance with yet another embodiment of the present invention, an integrated circuit device is provided comprising an integrated circuit pad, an internal integrated circuit, and an ESD protection circuit. The ESD protection circuit comprises a semiconductor structure arranged to define a doped silicon substrate, a drain region, a source region, an electrically insulating region, and a gate structure. The electrically insulating region is formed in the silicon substrate between the drain region and the source region. The drain region and the source region extend a first predetermined distance into the silicon substrate from the upper surface of the silicon substrate and the electrically insulating region extends a second predetermined distance into the silicon substrate from the upper surface of the silicon substrate. The second predetermined distance is at least as great as the first predetermined distance. The gate structure is arranged to define an incipient inversion layer in the drain region upon application of a relatively high electrical potential to the integrated circuit pad. Further, the gate structure is arranged to overlap a portion of the drain region such that, upon application of the relatively high electrical potential to the integrated circuit pad, gate-induced drain leakage current flows in the silicon substrate. The gate structure and the electrically insulating region are arranged to define an active gate region limited to extend in the vicinity of the upper surface of the silicon substrate from the drain region to the electrically insulating region.

The drain region, the source region, and the silicon substrate form a junction transistor having a characteristic breakdown voltage above which breakdown voltage breakdown current flows in the silicon substrate between the source region and the drain region. The gate structure and the silicon substrate are arranged such that the gate-induced drain leakage current reduces the characteristic breakdown voltage. The size and location of the electrically insulating region formed in the silicon substrate are such that the breakdown current tends to follow a path substantially offset from the active gate region.

In accordance with yet another embodiment of the present invention, an ESD protection circuit is conductively coupled to an integrated circuit pad so as to define an electrical path from the integrated circuit pad to the ESD protection circuit. The ESD protection circuit comprises a semiconductor structure arranged to define: a doped silicon substrate, a drain region formed in the silicon substrate, wherein the drain region is conductively coupled to the integrated circuit pad via the secondary electrical path; a source region formed in the silicon substrate, wherein the source region is conductively coupled to a relatively low electrical potential; an electrically insulating region formed in the silicon substrate between the drain region and the source region; and a gate structure conductively coupled to a relatively low electrical potential. The gate structure is arranged to define an incipient inversion layer in the drain region, wherein the incipient inversion layer is defined upon application of a relatively high electrical potential to the integrated circuit pad. The gate structure and the electrically insulating region are arranged to define an active gate region limited to extend from the drain region to the electrically insulating region.

In accordance with yet another embodiment of the present invention, an ESD protection circuit is provided wherein the gate structure is arranged to overlap a portion of the drain region such that, upon application of a relatively high electrical potential to the integrated circuit pad, gate-induced drain leakage current flows in the silicon substrate. Further, the gate structure and the electrically insulating region are arranged to define an active gate region limited to extend from the drain region to the electrically insulating region, such that the gate-induced drain leakage current tends to follow a path through the silicon substrate substantially offset from the active gate region.

In accordance with yet another embodiment of the present invention, a semiconductor structure is provided comprising a doped silicon substrate, a drain region, a source region, and an electrically insulating region formed in the silicon substrate, and a gate structure. The gate structure is arranged to define an incipient inversion layer in the drain region upon application of a relatively high electrical potential to the drain region and upon application of a relatively low electrical potential to the gate structure. The gate structure, in combination with the electrically insulating region, is further arranged to define an active gate region limited to extend from the drain region to the electrically insulating region.

In accordance with yet another embodiment of the present invention, a semiconductor structure is provided wherein the gate structure is arranged to overlap a portion of the drain region such that, upon application of a relatively high electrical potential to the drain region and upon application of a relatively low electrical potential to the gate structure, gate-induced drain leakage current flows in the silicon substrate. Further, the gate structure, in combination with the electrically insulating region, define an active gate region limited to extend from the drain region to the electrically insulating region, such that the gate-induced drain leakage current tends to follow a path through the silicon substrate substantially offset from the active gate region.

In accordance with yet another embodiment of the present invention, a method of manufacturing an integrated circuit device is provided comprising the steps of: conductively coupling an internal integrated circuit of the integrated circuit device to an integrated circuit pad so as to define a primary electrical path from the integrated circuit pad to the internal integrated circuit; and conductively coupling an ESD protection to the integrated circuit pad so as to define a secondary electrical path from the integrated circuit pad to the ESD protection circuit. The ESD protection circuit comprises a semiconductor structure arranged to define a doped silicon substrate, a drain region, a source region, an electrically insulating region, and a gate structure. The drain region is formed in the silicon substrate and is conductively coupled to the integrated circuit pad via the secondary electrical path. The source region is formed in the silicon substrate and is conductively coupled to a relatively low electrical potential. The electrically insulating region is formed in the silicon substrate between the drain region and the source region. The gate structure is conductively coupled to a relatively low electrical potential and is arranged to define an incipient inversion layer in the drain region, wherein the incipient inversion layer is defined upon application of a relatively high electrical potential to the integrated circuit pad. Further, the gate structure and the electrically insulating region are arranged to define an active gate region limited to extend from the drain region to the electrically insulating region.

In accordance with yet another embodiment of the present invention, a method of manufacturing an integrated circuit is provided wherein the gate structure is arranged to overlap a portion of the drain region such that, upon application of a relatively high electrical potential to the integrated circuit pad, gate-induced drain leakage current flows in the silicon substrate. Further, the gate structure and the electrically insulating region are arranged to define an active gate region limited to extend from the drain region to the electrically insulating region, such that the gate-induced drain leakage current tends to follow a path through the silicon substrate substantially offset from the active gate region.

In accordance with yet another embodiment of the present invention, a method of manufacturing a semiconductor structure is provided comprising the steps of: providing a doped silicon substrate; forming a drain region in the silicon substrate; forming a source region in the silicon substrate; forming an electrically insulating region in the silicon substrate between the drain region and the source region; and arranging a gate structure and the electrically insulating region to define (i) an incipient inversion layer in the drain region, wherein the incipient inversion layer is defined upon application of a relatively high electrical potential to the drain region and upon application of a relatively low electrical potential to the gate structure, and (ii) an active gate region limited to extend from the drain region to the electrically insulating region.

In accordance with yet another embodiment of the present invention, a method of manufacturing a semiconductor structure is provided wherein the gate structure and the electrically insulating region are arranged such that (i) the gate structure overlaps a portion of the drain region such that, upon application of a relatively high electrical potential to the drain region and upon application of a relatively low electrical potential to the gate structure, gate-induced drain leakage current flows in the silicon substrate, and (ii) the gate structure and the electrically insulating region define an active gate region limited to extend from the drain region to the electrically insulating region, such that the gate-induced drain leakage current tends to follow a path through the silicon substrate substantially offset from the active gate region.

Accordingly, it is an object of the present invention to provide an improved ESD protection scheme that provide a sufficiently low threshold turn on voltage while doing so with a semiconductor structure that is reliable and relatively inexpensive to manufacture. Other objects of the present invention will be apparent in light of the description of the invention embodied herein.

BRIEF DESCRIPTION OF THE SEVERAL VIEWS OF THE DRAWINGS

The following detailed description of the preferred embodiments of the present invention can be best understood when read in conjunction with the following drawings, where like structure is indicated with like reference numerals and in which.

DETAILED DESCRIPTION OF THE PREFERRED EMBODIMENTS

Figure 1:
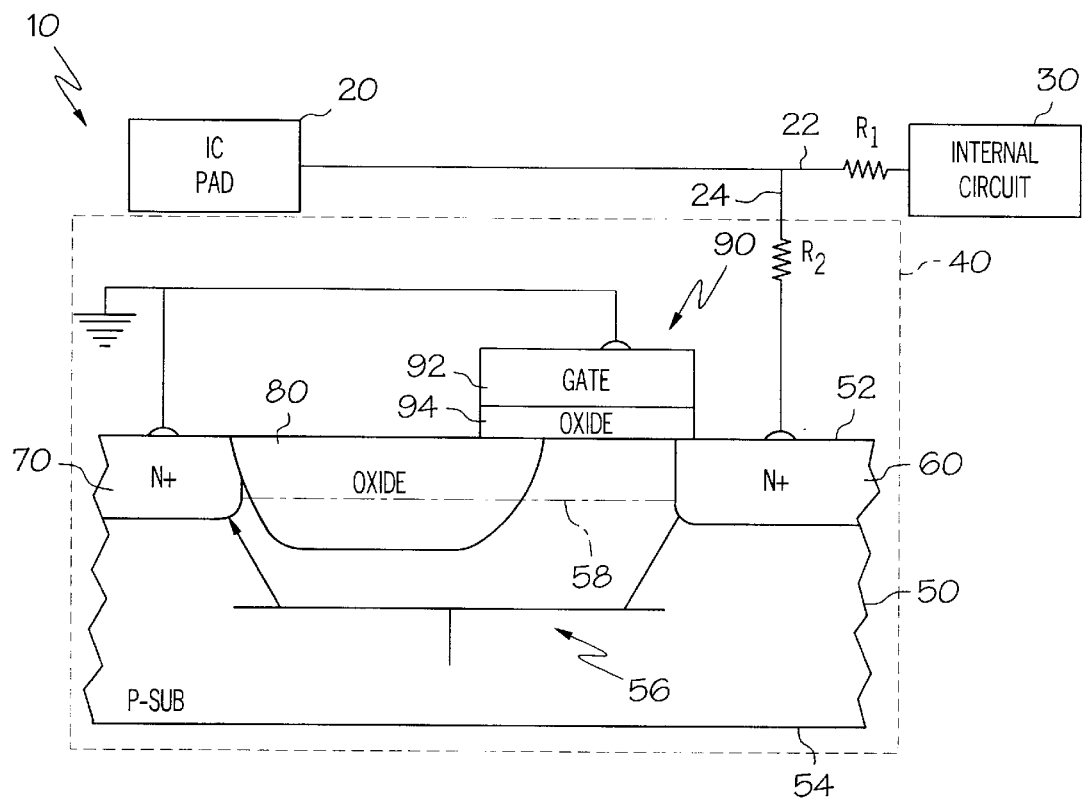
FIG. 1 is a schematic illustration of an ESD protection scheme of the present invention.
Figure 2:
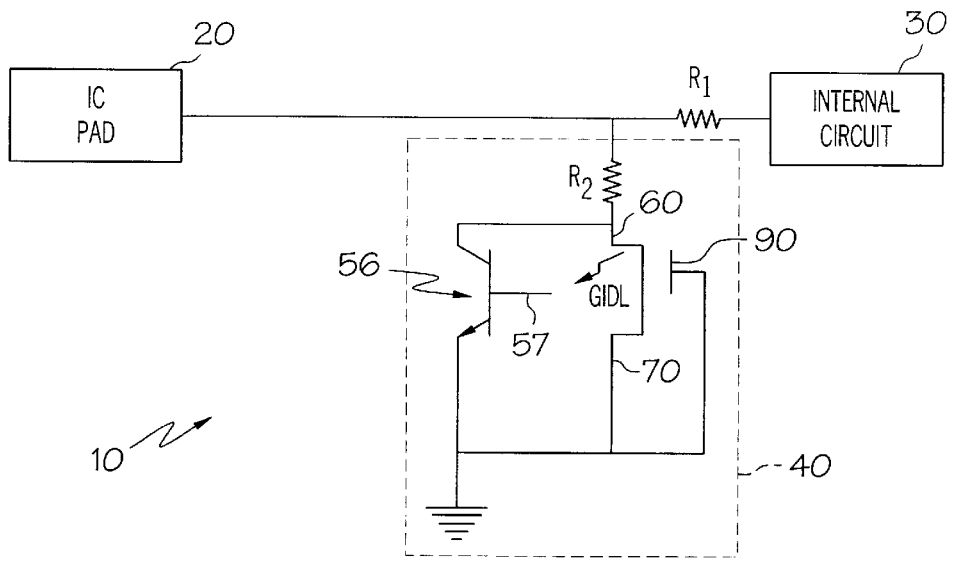
FIG. 2 is an equivalent circuit diagram of the ESD protection scheme illustrated in FIG. 1.

Referring now to FIGS. 1 and 2, an integrated circuit device 10 according to the present invention is illustrated. The integrated circuit device 10 comprises an integrated circuit pad 20, an internal integrated circuit 30, and an electrostatic discharge (ESD) protection circuit 40. The internal integrated circuit 30 is conductively coupled to the integrated circuit pad 20 so as to define a primary electrical path 22 from the integrated circuit pad 20 to the internal integrated circuit 30. The ESD protection circuit 40 is conductively coupled to the integrated circuit pad 20 so as to define a secondary electrical path 24 from the integrated circuit pad 20 to the ESD protection circuit 40.

Under normal operating conditions, current flows along the primary electrical path 22. However, where a relatively high electrical potential exists at the integrated circuit pad 20, the integrated circuit device 10 is designed such that the ESD protection circuit 40 begins conducting or undergoes breakdown and current flows along the secondary electrical path 24 to ground. The ESD protection circuit 40, described in detail below, is designed to be nondestructive and provides a normally open path that closes only when a high voltage appears at the integrated circuit pad 20 to harmlessly discharge the IC pad 20.

The normal electrical potential applied to the integrated circuit pad 20 causes current to flow along the primary electrical path 22 because the ESD protection circuit 40 is arranged, as is described in detail below, to have a modified characteristic breakdown voltage slightly higher than the normal electrical potential. In contrast, according to the present invention, a relatively high electrical potential applied to the integrated circuit pad 20 will flow along the secondary electrical path 24 if the high electrical potential exceeds the modified breakdown voltage of the ESD protection circuit 40. As a result, the potentially damaging and relatively high electrical potential does not reach the internal circuit 30.

The structure of the ESD protection circuit 40, described in further detail below, may be arranged such that it defines any one of a variety of breakdown voltages, depending upon the particular design parameters of the internal circuit 30 with which it is to be used. For example, where the normal electrical potential is approximately 5 Volts, the modified breakdown voltage of the ESD protection circuit 40 may be arranged to be approximately 10 Volts. Further, the ESD protection circuit 40 is designed such that it may repeatedly undergo breakdown without significantly damaging its operation as an ESD protection circuit 40. Resistors $R_1$ and $R_2$ provide attenuation in the ESD protection scheme to allow time for the ESD protection circuit 40 to respond to a relatively high electrical potential and to protect the internal structure of the ESD protection circuit 40.

The ESD protection circuit 40 comprises a semiconductor structure arranged to define a doped silicon substrate 50, a drain region 60, a source region 70, an electrically insulating region 80, and a gate structure 90. The doped silicon substrate 50 includes an upper surface 52 and a substantially parallel lower surface 54. The drain region 60 is formed in the silicon substrate 50 and is conductively coupled to the integrated circuit pad 20 via the secondary electrical path 24. The source region 70 is formed in the silicon substrate 50 and is conductively coupled to ground or some other relatively low electrical potential. The doped silicon substrate 50 comprises a doped p-type silicon substrate and the drain region 60 and the source region 70 comprise doped $n^+$ regions. For the purposes of describing and defining the present invention, it is understood that the relatively high electrical potential may comprise a positive or a negative potential and the relatively low electrical potential comprises a voltage that is less positive than a relatively high positive electrical potential and less negative than a relatively high negative electrical potential.

The electrically insulating region 80 is formed in the silicon substrate 50 between the drain region 60 and the source region 70. As is illustrated in FIG. 1, the drain region 60 and the source region 70 extend a first predetermined distance into the silicon substrate 50 from the upper surface 52 of the substrate 50. Similarly, the electrically insulating region 80 extends a second predetermined distance into the silicon substrate 50 from the upper surface 52 of the substrate 50. The second predetermined distance is at least as great as, and preferably greater than, the first predetermined distance.

The gate structure 90 includes a gate electrode 92 and a gate oxide layer 94 and is formed on the upper surface 52 of the silicon substrate 50. The gate electrode 92 is conductively coupled to ground or some other relatively low electrical potential. In the illustrated embodiment, the gate structure 90 is arranged to define an incipient inversion layer in the drain region 60 upon application of a relatively high electrical potential to the integrated circuit pad 20.

The nature and location of the incipient inversion layer may be described with reference to S. Wolf, *Silicon Processing for the VLSI Era*, Volume 3, 1995, where the relationship between gate-induced drain leakage (GIDL) and the incipient inversion layer is described. GIDL current is observed in off-state MOSFET devices. Referring now to FIG. 1, the carriers responsible for GIDL originate in the region of the drain 60 that is overlapped by the gate structure 90. The gate structure 90 is arranged to overlap a portion of the drain region 60 such that, upon application of a relatively high electrical potential to the integrated circuit pad 20, gate-induced drain leakage current flows in the silicon substrate 50. Specifically, GIDL occurs when the gate 90 is grounded and the drain 60 is at a relatively high electrical potential. Under these conditions, a substantial electric field exists across the gate oxide layer 94. This electric field must be supported by charge in the drain region 60. This charge is provided by the formation of a depletion region in the drain 60. If the electric field becomes sufficiently large an inversion layer will attempt to form at the silicon surface of the drain 60. However, as minority carriers arrive at the surface to form the inversion layer, they are immediately swept laterally to the substrate 50 because the substrate 50 is a region of lower potential for the minority carriers. Hence, in this case, the depletion region under the gate oxide layer 94 in the drain 60 becomes a deep depletion layer. The zone near the surface where an inversion layer should be formed is referred to as the incipient inversion layer. The current that flows as a result of the carriers being swept from this incipient inversion layer constitute the GIDL current.

In conventional MOSFET devices, the gate structure defines an active gate region in the silicon substrate that extends from the drain to the source. In contrast, the gate structure 90 and the electrically insulating region 80 of the present invention are arranged to define an active gate region limited to extend in the vicinity of the upper surface 52 of the silicon substrate from the drain region 60 to the electrically insulating region 80. More specifically, as is clearly illustrated in FIG. 1, the active gate region extends from the drain region 60 to the electrically insulating region 80 along the upper surface 52 of the silicon substrate 50 adjacent the gate oxide layer 94. As a result, the GIDL current tends to follow a path through silicon substrate substantially offset from the active gate region. For the purposes of describing and defining the present invention, the GIDL path is said to be substantially offset from the active gate region because it must flow around the electrically insulating region 80 and cannot flow directly between the drain region 60 and the source region 70. Further, the portion of the substrate 50 directly beneath the gate structure 90 is referred to herein as the active gate region because, but for the existence of the electrically insulating region 80, it would otherwise function as a typical active gate region in a conventional MOSFET device.

The drain region 60, the source region 70, and the silicon substrate 50 form a junction transistor having a characteristic breakdown voltage, illustrated schematically as transistor symbol 56 in FIG. 1. When the potential at the integrated circuit pad 20 exceed the characteristic breakdown voltage of the junction transistor 56, breakdown current will flow in the silicon substrate 50 between the source region 70 and the drain region 60. The gate structure 90 and the silicon substrate 50 are arranged such that the GIDL current originating in the vicinity of the drain region 60 reduces or modifies the characteristic breakdown voltage of the junction transistor 56 to make the ESD protection circuit 40 trigger or turn on at a lower threshold voltage. Referring now to FIG. 2, an equivalent circuit diagram of the ESD protection scheme of the present invention is illustrated. As is illustrated in FIG. 2, the GIDL current feeds current to the base 57 of the junction transistor 56 to provide the base current needed to reduce or modify the characteristic breakdown voltage of the junction transistor 56.

The size and location of the electrically insulating region 80 formed in the silicon substrate 50 are such that the breakdown current, like the GIDL current, tends to follow a path substantially offset from the active gate region. Specifically, the electrically insulating region 80 is formed in the silicon substrate 50 so as to intersect a linear projection 58 extending from the drain region 60 to the source region 70. Preferably, the insulating region 80 is positioned so as to intersect a linear projection 58 extending along the shortest distance from the drain region 60 to the source region 70. Further, as is illustrated in FIG. 1, the electrically insulating region 80 is arranged to extend into the silicon substrate 50 at least as far as, and preferably farther than, than the drain region 60 and the source region 70. The gate structure 90 is displaced from the source region 70 along the upper surface 52 of the silicon substrate 50. In addition, the electrically insulating region 80 is defined in the silicon substrate 50 and extends from the source region 70 to the gate structure 90 along the upper surface 52 of the silicon substrate 50.

The integrated circuit device 10 of the present invention is manufactured by conductively coupling the internal integrated circuit 30 of the integrated circuit device 10 to the integrated circuit pad 20 so as to define the primary electrical path 22 from the integrated circuit pad 20 to the internal integrated circuit 30. Further, the ESD protection circuit 40 is conductively coupled to the integrated circuit pad 20 so as to define the secondary electrical path 24 from the integrated circuit pad 20 to the ESD protection circuit 40. Preferably the integrated circuit device 10 further comprises an IC package encapsulating the internal integrated circuit 30 and the ESD protection circuit 40. As will be appreciated by those practicing the present invention, the IC pad 20 is not fully encapsulated within the IC package and provides an external electrical connection to the encapsulated circuit elements.

Having described the invention in detail and by reference to preferred embodiments thereof, it will be apparent that modifications and variations are possible without departing from the scope of the invention defined in the appended claims.

What is claimed is:

1. An integrated circuit device comprising:
   an integrated circuit pad;
   an internal integrated circuit conductively coupled to said integrated circuit pad so as to define a primary electrical path from said integrated circuit pad to said internal integrated circuit; and
   an ESD protection circuit conductively coupled to said integrated circuit pad so as to define a secondary electrical path from said integrated circuit pad to said ESD protection circuit, said ESD protection circuit comprising a semiconductor structure arranged to define a doped silicon substrate;

a drain region formed in said silicon substrate, wherein said drain region is conductively coupled to said integrated circuit pad via said secondary electrical path, a source region formed in said silicon substrate, wherein said source region is conductively coupled to a relatively low electrical potential, an electrically insulating region formed in said silicon substrate between said drain region and said source region, and a gate structure conductively coupled to a relatively low electrical potential, wherein said gate structure is arranged to define an incipient inversion layer in said drain region, wherein said incipient inversion layer is defined upon application of a relatively high electrical potential to said integrated circuit pad, and said gate structure and said electrically insulating region are arranged to define an active gate region limited to extend from said drain region to said electrically insulating region.

2. An integrated circuit device as claimed in claim 1 wherein the size and location of said electrically insulating region formed in said silicon substrate are such that, upon application of said relatively high electrical potential to said integrated circuit pad, an electrostatic discharge current path between said source region and said drain region tends to follow a path through said silicon substrate substantially offset from said active gate region.

3. An integrated circuit device as claimed in claim 1 wherein the size and location of said electrically insulating region formed in said silicon substrate are such that, upon application of said relatively high electrical potential to said integrated circuit pad, an electrostatic discharge current path between said source region and said drain region tends to follow a path through said silicon substrate around said electrically insulating region.

4. An integrated circuit device as claimed in claim 1 wherein said electrically insulating region is formed in said silicon substrate so as to intersect a linear projection extending from said drain region to said source region.

5. An integrated circuit device as claimed in claim 4 wherein said linear projection extends along the shortest distance from said drain region to said source region.

6. An integrated circuit device as claimed in claim 1 wherein:

said silicon substrate defines an upper surface and a substantially parallel lower surface;

said drain region and said source region extend a first predetermined distance into said silicon substrate from said upper surface of said silicon substrate;

said electrically insulating region extends a second predetermined distance into said silicon substrate from said upper surface of said silicon substrate; and wherein said second predetermined distance is at least as great as said first predetermined distance.

7. An integrated circuit device as claimed in claim 1 wherein:

said silicon substrate defines an upper surface and a substantially parallel lower surface;

said drain region and said source region extend a first predetermined distance into said silicon substrate from said upper surface;

said electrically insulating region extends a second predetermined distance into said silicon substrate from said upper surface of said silicon substrate; and wherein said second predetermined distance is substantially greater than said first predetermined distance.

8. An integrated circuit device as claimed in claim 1 wherein said doped silicon substrate comprises a doped p-type silicon substrate, wherein said drain region and said source region comprise doped $n^+$ regions, and wherein said relatively high electrical potential is a positive electrical potential.

9. An integrated circuit device as claimed in claim 1 wherein said doped silicon substrate comprises a doped p-type silicon substrate, wherein said drain region and said source region comprise doped $n^+$ regions, and wherein said relatively high electrical potential is a negative electrical potential.

10. An integrated circuit device as claimed in claim 1 further comprising an IC package encapsulating said internal integrated circuit and said ESD protection circuit.

11. An integrated circuit device as claimed in claim 1 wherein:

said gate structure includes a gate electrode and a gate oxide layer formed on an upper surface of said silicon substrate; and said active gate region extends from said drain region to said electrically insulating region along said upper surface of said silicon substrate adjacent said gate oxide layer.

12. An integrated circuit device as claimed in claim 1 wherein:

said gate structure includes a gate electrode and a gate oxide layer formed on an upper surface of said silicon substrate; and said active gate region is defined in said silicon substrate along said upper surface of said silicon substrate between said drain region and said electrically insulating region.

13. An integrated circuit device as claimed in claim 1 wherein:

said gate structure includes a gate electrode and a gate oxide layer formed on an upper surface of said semiconductor structure;

said gate structure is displaced from said source region along said upper surface of said semiconductor structure;

said electrically insulating region is defined in said silicon substrate and extends from said source region to said gate structure along said upper surface of said semiconductor structure.

14. An integrated circuit device comprising:

an integrated circuit pad;

an internal integrated circuit conductively coupled to said integrated circuit pad so as to define a primary electrical path from said integrated circuit pad to said internal integrated circuit; and an ESD protection circuit conductively coupled to said integrated circuit pad so as to define a secondary electrical path from said integrated circuit pad to said ESD protection circuit, said ESD protection circuit comprising a semiconductor structure arranged to define a doped silicon substrate;

a drain region formed in said silicon substrate, wherein said drain region is conductively coupled to said integrated circuit pad via said secondary electrical path, a source region formed in said silicon substrate, wherein said source region is conductively coupled to a relatively low electrical potential, an electrically insulating region formed in said silicon substrate between said drain region and said source region, and a gate structure conductively coupled to a relatively low electrical potential, wherein said gate structure is arranged such that, upon application of a relatively high electrical potential to said integrated circuit pad, gate-induced drain leakage current flows in said silicon substrate, and said gate structure and said electrically insulating region are arranged to define an active gate region limited to extend from said drain region to said electrically insulating region, such that said gate-induced drain leakage current tends to follow a path through said silicon substrate substantially offset from said active gate region.

15. An integrated circuit device as claimed in claim 14 wherein said gate structure is arranged to define an incipient inversion layer in said drain region upon application of said relatively high electrical potential to said integrated circuit pad.

16. An integrated circuit device as claimed in claim 14 wherein said silicon substrate defines an upper surface and a substantially parallel lower surface;

said gate structure is formed on said upper surface of said substrate;

said active gate region extends in the vicinity of said upper surface of said substrate;

said drain region, said source region, and said silicon substrate form a junction transistor having a characteristic breakdown voltage above which breakdown voltage breakdown current flows in said silicon substrate between said source region and said drain region;

said gate structure and said silicon substrate are arranged such that said gate-induced drain leakage current reduces said characteristic breakdown voltage; and wherein the size and location of said electrically insulating region formed in said silicon substrate are such that said breakdown current tends to follow a path substantially offset from said active gate region.

17. An integrated circuit device as claimed in claim 14 wherein said electrically insulating region is formed in said silicon substrate so as to intersect a linear projection extending from said drain region to said source region.

18. An integrated circuit device as claimed in claim 14 wherein said linear projection extends along the shortest distance from said drain region to said source region.

19. An integrated circuit device as claimed in claim 14 wherein:

said silicon substrate defines an upper surface and a substantially parallel lower surface;

said drain region and said source region extend a first predetermined distance into said silicon substrate from said upper surface of said silicon substrate;

said electrically insulating region extends a second predetermined distance into said silicon substrate from said upper surface of said silicon substrate; and wherein said second predetermined distance is at least as great as said first predetermined distance.

20. An integrated circuit device as claimed in claim 14 wherein:

said silicon substrate defines an upper surface and a substantially parallel lower surface;

said drain region and said source region extend a first predetermined distance into said silicon substrate from said upper surface of said silicon substrate;

said electrically insulating region extends a second predetermined distance into said silicon substrate from said upper surface of said silicon substrate; and wherein said second predetermined distance is substantially greater than said first predetermined distance.

21. An integrated circuit device as claimed in claim 14 wherein said doped silicon substrate comprises a doped p-type silicon substrate, wherein said drain region and said source region comprise doped $n^+$ regions, and wherein said relatively high electrical potential is a positive electrical potential.

22. An integrated circuit device as claimed in claim 14 wherein said doped silicon substrate comprises a doped p-type silicon substrate, wherein said drain region and said source region comprise doped $n^+$ regions, and wherein said relatively high electrical potential is a negative electrical potential.

23. An integrated circuit device as claimed in claim 14 further comprising an IC package encapsulating said internal integrated circuit and said ESD protection circuit.

24. An integrated circuit device as claimed in claim 14 wherein:

said gate structure includes a gate electrode and a gate oxide layer formed on an upper surface of said silicon substrate; and said active gate region extends from said drain region to said electrically insulating region along said upper surface of said silicon substrate adjacent said gate oxide layer.

25. An integrated circuit device as claimed in claim 14 wherein:

said gate structure includes a gate electrode and a gate oxide layer formed on an upper surface of said silicon substrate; and said active gate region is defined in said silicon substrate along said upper surface of said silicon substrate between said drain region and said electrically insulating region.

26. An integrated circuit device as claimed in claim 14 wherein:

said gate structure includes a gate electrode and a gate oxide layer formed on an upper surface of said semiconductor structure;

said gate structure is displaced from said source region along said upper surface of said semiconductor structure;

said electrically insulating region is defined in said silicon substrate and extends from said source region to said gate structure along said upper surface of said semiconductor structure.

27. An integrated circuit device comprising:

an integrated circuit pad;

an internal integrated circuit conductively coupled to said integrated circuit pad so as to define a primary electrical path from said integrated circuit pad to said internal integrated circuit; and an ESD protection circuit conductively coupled to said integrated circuit pad so as to define a secondary electrical path from said integrated circuit pad to said ESD protection circuit, said ESD protection circuit comprising a semiconductor structure arranged to define a doped silicon substrate having an upper surface and a substantially parallel lower surface;

a drain region formed in said silicon substrate, wherein said drain region is conductively coupled to said integrated circuit pad via said secondary electrical path, a source region formed in said silicon substrate, wherein said source region is conductively coupled to a relatively low electrical potential, an electrically insulating region formed in said silicon substrate between said drain region and said source region, wherein said drain region and said source region extend a first predetermined distance into said silicon substrate from said upper surface of said silicon substrate, wherein said electrically insulating region extends a second predetermined distance into said silicon substrate from said upper surface of said silicon substrate, and wherein said second predetermined distance is at least as great as said first predetermined distance, and a gate structure formed on said upper surface of said silicon substrate and conductively coupled to a relatively low electrical potential, wherein said gate structure is arranged to define an incipient inversion layer in said drain region, wherein said incipient inversion layer is defined upon application of a relatively high electrical potential to said integrated circuit pad, said gate structure is arranged to overlap a portion of said drain region such that, upon application of said relatively high electrical potential to said integrated circuit pad, gate-induced drain leakage current flows in said silicon substrate, and said gate structure and said electrically insulating region are arranged to define an active gate region limited to extend in the vicinity of said upper surface of said silicon substrate from said drain region to said electrically insulating region, wherein said drain region, said source region, and said silicon substrate form a junction transistor having a characteristic breakdown voltage above which breakdown voltage breakdown current flows in said silicon substrate between said source region and said drain region, wherein said gate structure and said silicon substrate are arranged such that said gate-induced drain leakage current reduces said characteristic breakdown voltage, and wherein the size and location of said electrically insulating region formed in said silicon substrate are such that said breakdown current tends to follow a path substantially offset from said active gate region.

28. An ESD protection circuit conductively coupled to an integrated circuit pad so as to define an electrical path from the integrated circuit pad to said ESD protection circuit, said ESD protection circuit comprising a semiconductor structure arranged to define:

a doped silicon substrate;

a drain region formed in said silicon substrate, wherein said drain region is conductively coupled to said integrated circuit pad via said secondary electrical path;

a source region formed in said silicon substrate, wherein said source region is conductively coupled to a relatively low electrical potential;

an electrically insulating region formed in said silicon substrate between said drain region and said source region; and a gate structure conductively coupled to a relatively low electrical potential, wherein said gate structure is arranged to define an incipient inversion layer in said drain region, wherein said incipient inversion layer is defined upon application of a relatively high electrical potential to said integrated circuit pad, and said gate structure and said electrically insulating region are arranged to define an active gate region limited to extend from said drain region to said electrically insulating region.

29. An ESD protection circuit as claimed in claim 28 wherein the size and location of said electrically insulating region formed in said silicon substrate are such that, upon application of said relatively high electrical potential to said integrated circuit pad, an electrostatic breakdown current path between said source region and said drain region tends to follow a path through said silicon substrate substantially offset from said active gate region.

30. An ESD protection circuit as claimed in claim 28 wherein the size and location of said electrically insulating region formed in said silicon substrate are such that, upon application of said relatively high electrical potential to said integrated circuit pad, a breakdown current path between said source region and said drain region tends to follow a path through said silicon substrate around said electrical insulating region.

31. An ESD protection circuit as claimed in claim 28 wherein:

said gate structure includes a gate electrode and a gate oxide layer formed on an upper surface of said silicon substrate; and said active gate region extends from said drain region to said electrically insulating region along said upper surface of said silicon substrate adjacent said gate oxide layer.

32. An ESD protection circuit as claimed in claim 28 wherein:

said gate structure includes a gate electrode and a gate oxide layer formed on an upper surface of said silicon substrate; and said active gate region is defined in said silicon substrate along said upper surface of said silicon substrate between said drain region and said electrically insulating region.

33. An ESD protection circuit as claimed in claim 28 wherein:

said gate structure includes a gate electrode and a gate oxide layer formed on an upper surface of said semiconductor structure;

said gate structure is displaced from said source region along said upper surface of said semiconductor structure;

said electrically insulating region is defined in said silicon substrate and extends from said source region to said gate structure along said upper surface of said semiconductor structure.

34. An ESD protection circuit conductively coupled to said integrated circuit pad so as to define a secondary electrical path from an integrated circuit pad to said ESD protection circuit, said ESD protection circuit comprising a semiconductor structure arranged to define:

a doped silicon substrate;

a drain region formed in said silicon substrate, wherein said drain region is conductively coupled to said integrated circuit pad via said secondary electrical path;

a source region formed in said silicon substrate, wherein said source region is conductively coupled to a relatively low electrical potential;

an electrically insulating region formed in said silicon substrate between said drain region and said source region; and a gate structure conductively coupled to a relatively low electrical potential, wherein said gate structure is arranged such that, upon application of a relatively high electrical potential to said integrated circuit pad, gate-induced drain leakage current flows in said silicon substrate, and said gate structure and said electrically insulating region are arranged to define an active gate region limited to extend from said drain region to said electrically insulating region, such that said gate-induced drain leakage current tends to follow a path through said silicon substrate substantially offset from said active gate region.

35. An ESD protection circuit as claimed in claim 34 wherein said gate structure is arranged to define an incipient inversion layer in said drain region upon application of said relatively high electrical potential to said integrated circuit pad.

36. An ESD protection circuit as claimed in claim 34 wherein said silicon substrate defines an upper surface and a substantially parallel lower surface;

said gate structure is formed on said upper surface of said silicon substrate;

said active gate region extends in the vicinity of said upper surface of said substrate;

said drain region, said source region, and said silicon substrate form a junction transistor having a characteristic breakdown voltage above which breakdown voltage breakdown current flows in said silicon substrate between said source region and said drain region;

said gate structure and said silicon substrate are arranged such that said gate-induced drain leakage current reduces said characteristic breakdown voltage; and wherein the size and location of said electrically insulating region formed in said silicon substrate are such that said breakdown current tends to follow a path substantially offset from said active gate region.

37. An ESD protection circuit as claimed in claim 34 wherein:

said gate structure includes a gate electrode and a gate oxide layer formed on an upper surface of said silicon substrate; and said active gate region extends from said drain region to said electrically insulating region along said upper surface of said silicon substrate adjacent said gate oxide layer.

38. An ESD protection circuit as claimed in claim 34 wherein:

said gate structure includes a gate electrode and a gate oxide layer formed on an upper surface of said silicon substrate; and said active gate region is defined in said silicon substrate along said upper surface of said silicon substrate between said drain region and said electrically insulating region.

39. An ESD protection circuit as claimed in claim 34 wherein:

said gate structure includes a gate electrode and a gate oxide layer formed on an upper surface of said semiconductor structure;

said gate structure is displaced from said source region along said upper surface of said semiconductor structure;

said electrically insulating region is defined in said silicon substrate and extends from said source region to said gate structure along said upper surface of said semiconductor structure.

40. A semiconductor structure comprising:

a doped silicon substrate;

a drain region formed in said silicon substrate;

a source region formed in said silicon substrate;

an electrically insulating region formed in said silicon substrate between said drain region and said source region; and a gate structure arranged to define an incipient inversion layer in said drain region, wherein said incipient inversion layer is defined upon application of a relatively high electrical potential to said drain region and upon application of a relatively low electrical potential to said gate structure, and, in combination with said electrically insulating region, an active gate region limited to extend from said drain region to said electrically insulating region.

41. A semiconductor structure as claimed in claim 40 wherein the size and location of said electrically insulating region formed in said silicon substrate are such that, upon application of said relatively high electrical potential to said drain region, a breakdown current path between said source region and said drain region tends to follow a path through said silicon substrate substantially offset from said active gate region.

42. A semiconductor structure as claimed in claim 40 wherein the size and location of said electrically insulating region formed in said silicon substrate are such that, upon application of said relatively high electrical potential to said drain region, a breakdown current path between said source region and said drain region tends to follow a path through said silicon substrate around said electrically insulating region.

43. A semiconductor structure as claimed in claim 40 wherein:

said gate structure includes a gate electrode and a gate oxide layer formed on an upper surface of said silicon substrate; and said active gate region extends from said drain region to said electrically insulating region along said upper surface of said silicon substrate adjacent said gate oxide layer.

44. A semiconductor structure as claimed in claim 40 wherein:

said gate structure includes a gate electrode and a gate oxide layer formed on an upper surface of said silicon substrate; and said active gate region is defined in said silicon substrate along said upper surface of said silicon substrate between said drain region and said electrically insulating region.

45. A semiconductor structure as claimed in claim 40 wherein:

said gate structure includes a gate electrode and a gate oxide layer formed on an upper surface of said semiconductor structure;

said gate structure is displaced from said source region along said upper surface of said semiconductor structure;

said electrically insulating region is defined in said silicon substrate and extends from said source region to said gate structure along said upper surface of said semiconductor structure.

46. A semiconductor structure comprising:

a doped silicon substrate;

a drain region formed in said silicon substrate;

a source region formed in said silicon substrate;

an electrically insulating region formed in said silicon substrate between said drain region and said source region; and a gate structure arranged to overlap a portion of said drain region such that, upon application of a relatively high electrical potential to said drain region and upon application of a relatively low electrical potential to said gate structure, gate-induced drain leakage current flows in said silicon substrate, and, in combination with said electrically insulating region, define an active gate region limited to extend from said drain region to said electrically insulating region, such that said gate-induced drain leakage current tends to follow a path through said silicon substrate substantially offset from said active gate region.

47. A semiconductor structure as claimed in claim 46 wherein said gate structure is arranged to define an incipient inversion layer in said drain region upon application of said relatively high electrical potential to said drain region.

48. A semiconductor structure as claimed in claim 46 wherein:

said silicon substrate defines an upper surface and a substantially parallel lower surface;

said gate structure is formed on said upper surface of said silicon substrate;

said active gate region extends in the vicinity of said upper surface of said substrate;

said drain region, said source region, and said silicon substrate form a junction transistor having a characteristic breakdown voltage above which breakdown voltage breakdown current flows in said silicon substrate between said source region and said drain region;

said gate structure and said silicon substrate are arranged such that said gate-induced drain leakage current reduces said characteristic breakdown voltage; and wherein the size and location of said electrically insulating region formed in said silicon substrate are such that said breakdown current tends to follow a path substantially offset from said active gate region.

* * * * *

UNITED STATES PATENT AND TRADEMARK OFFICE
CERTIFICATE OF CORRECTION

| | |
|---|---|
| PATENT NO. | : 6,204,537 B1 |
| DATED | : March 20, 2001 |
| INVENTOR(S) | : Manny Kin F. Ma |

It is certified that error appears in the above-identified patent and that said Letters Patent is hereby corrected as shown below:

<u>Column 7,</u>
Line 27, "layer 94" should read -- layer 92 --.

Signed and Sealed this

Twenty-third Day of October, 2001

Attest:

*Nicholas P. Godici*

NICHOLAS P. GODICI
*Acting Director of the United States Patent and Trademark Office*

*Attesting Officer*